United States Patent
Ayari et al.

(10) Patent No.: US 12,155,005 B2
(45) Date of Patent: Nov. 26, 2024

(54) METHOD FOR LARGE SCALE GROWTH AND FABRICATION OF III-NITRIDE DEVICES ON 2D-LAYERED H-BN WITHOUT SPONTANEOUS DELAMINATION

(71) Applicant: Georgia Tech Research Corporation, Atlanta, GA (US)

(72) Inventors: Taha Ayari, Metz (FR); Abdallah Ougazzaden, Metz (FR); Suresh Sundaram, Metz (FR)

(73) Assignee: Georgia Tech Research Corporation, Atlanta, GA (US)

( * ) Notice: Subject to any disclaimer, the term of this patent is extended or adjusted under 35 U.S.C. 154(b) by 483 days.

(21) Appl. No.: 17/613,563

(22) PCT Filed: May 22, 2020

(86) PCT No.: PCT/IB2020/054906
§ 371 (c)(1),
(2) Date: Nov. 23, 2021

(87) PCT Pub. No.: WO2020/234847
PCT Pub. Date: Nov. 26, 2020

(65) Prior Publication Data
US 2022/0231188 A1    Jul. 21, 2022

Related U.S. Application Data

(60) Provisional application No. 62/851,997, filed on May 23, 2019.

(51) Int. Cl.
*H01L 33/00* (2010.01)
(52) U.S. Cl.
CPC ........ *H01L 33/0093* (2020.05); *H01L 33/007* (2013.01)

(58) Field of Classification Search
CPC ... H01L 33/0093; H01L 33/007; H01L 33/32; H01L 21/0242; H01L 21/02458;
(Continued)

(56) References Cited

U.S. PATENT DOCUMENTS

| 6,151,347 A | 11/2000 | Noel et al. |
| 7,888,686 B2 | 2/2011 | Chik et al. |

(Continued)

OTHER PUBLICATIONS

Ayari, T., Bishop, C., Jordan, M.B. et al. Gas sensors boosted by two-dimensional h-BN enabled transfer on thin substrate foils: towards wearable and portable applications. Sci Rep 7, 15212 (2017) (Year: 2017).*

(Continued)

*Primary Examiner* — Jarrett J Stark
(74) *Attorney, Agent, or Firm* — Troutman Pepper Hamilton Sanders LLP; Ryan A. Schneider; Brandon M. Reed

(57) ABSTRACT

An embodiment of the disclosed technology provides a scalable method of growing nitride-based LED devices on a growth substrate and transferring an individually selected nitride-based LED device to a receiving substrate. The method can include subdividing the growth substrate into delimited areas using a patterned grid. A mechanical release layer can be grown on the growth substrate. A set of nitride-based LED devices can be grown on the mechanical release layer, such that a nitride-based LED device can be grown in each delimited area. An individual nitride-based LED device can be selected and released from the growth substrate. The selected nitride-based LED device can be transferred to the receiving substrate.

25 Claims, 13 Drawing Sheets

(58) Field of Classification Search
CPC ........... H01L 21/02499; H01L 21/0254; H01L 21/02658; H01L 29/155; H01L 29/2003
See application file for complete search history.

(56) References Cited

U.S. PATENT DOCUMENTS

| | | |
|---|---|---|
| 8,435,816 B2 | 5/2013 | Xiong et al. |
| 9,110,200 B2 | 8/2015 | Nichol et al. |
| 9,666,759 B2 | 5/2017 | Rho et al. |
| 2007/0102111 A1* | 5/2007 | Monsma .............. H10K 85/221 156/296 |
| 2019/0053347 A1* | 2/2019 | Lee ..................... H01L 25/0756 |
| 2020/0043790 A1* | 2/2020 | Lee ................... H01L 21/02546 |
| 2021/0125826 A1* | 4/2021 | Myers-Ward ..... H01L 21/02598 |

OTHER PUBLICATIONS

A Vertical InGaN/GaN Light-Emitting Diode Fabricated on a Flexible Substrate by a Mechanical Transfer Method Using BN Toshiki Makimoto et al 2012 Appl. Phys. (Year: 2012).*

Transferrable AlGaN/GaN High-Electron Mobility Transistors to Arbitrary Substrates via a Two-Dimensional Boron Nitride Release Layer Motala et al. ACS Applied Materials & Interfaces 2020 (Year: 2020).*

Effectiveness of selective area growth using van der Waals h-BN layer for crack-free transfer of large-size III-N devices onto arbitrary substrates Karrakchou et al. Scientific Reports vol. 10, Article No. 21709 (2020) (Year: 2020).*

International Search Report and Written Opinion from Application No. PCT/IB2020/054906 dated Aug. 19, 2020.

* cited by examiner

METHOD FOR LARGE SCALE GROWTH AND FABRICATION OF III-NITRIDE DEVICES ON 2D-LAYERED H-BN WITHOUT SPONTANEOUS DELAMINATION

CROSS-REFERENCE TO RELATED APPLICATIONS

This application claims priority, and benefit under 35 U.S.C. § 119(e), to U.S. Provisional Patent Application No. 62/851,997 filed 23 May 2019, which is hereby hereby incorporated by reference in its entirety as if fully set forth below.

FIELD OF DISCLOSURE

The disclosed technology relates generally to nitride-based optoelectronic and electronic devices, and more particularly to, systems and methods for growing and releasing nitride-based LED devices using a patterned growth substrate.

BACKGROUND

With the electronics industry entering an era of acceleration and disruption, the role of heterogenous integration can be significant in response to the driving forces of several emerging fields, including IoT, smart mobile, and intelligent automotive. One approach to heterogeneous integration can include the transfer of epilayers from their native growth substrate to a dissimilar receiving substrate. A range of epitaxial layer separation approaches have been developed including laser liftoff and chemical liftoff which dissolves a sacrificial layer to perform heterogenous integration. In particular, van der Waals epitaxy of III-nitrides on graphene and device transfer on foreign substrates have been demonstrated.

However, for a manufacturing setting, this latter technique regarding van der Waals epitaxy of III-nitrides on graphene can require significant capital expenses since graphene templates have to be prefabricated in a separate step. More recently, the use of 2D hexagonal boron nitride ("h-BN") as a mechanical release layer has been demonstrated to be a promising liftoff technique for the hybrid integration of III-nitride devices. H-BN is a III-nitride material which can exhibit a 2D structure when grown as monolayers of nanometer thicknesses, similar to graphene. It can be particularly compatible with growth of wurtzite III-N devices in a single epitaxial run. The h-BN based liftoff technique can provide several advantages including 1) very rapid process, 2) no costly excimer laser is needed, 3) no laser damage, resulting in smooth separated surfaces, and 4) no need for time consuming and hazardous chemical treatments. Moreover, h-BN is chemically inert and mechanically stable at elevated temperatures and thus can have no constraints on growth conditions of subsequent epilayers above when compared to other growth and liftoff processes. In order for this h-BN based liftoff technique to reach industrial maturity, innovative solutions are needed to facilitate mass production while preserving devices performance.

Accordingly, a need exists for systems and methods for mass production of high-quality nitride-based LED devices that can be grown on a growth substrate, released from the growth substrate, and transferred to a receiving substrate without spontaneous delamination.

SUMMARY

The present disclosure relates to a scalable method of growing and releasing nitride-based LED devices. A growth substrate can be subdivided into delimited areas chosen for nitride-based LED device locations. By subdividing the growth substrate, separation of the grown nitride-based LED devices can be enabled and device-by-device pick-and-place release and transfer of the nitride-based LED devices from the growth substrate to the receiving substrate can occur without the need for a dicing step.

The disclosed technology can include a method of growing and releasing nitride-based LED devices including providing a growth substrate; subdividing the growth substrate into a plurality of delimited areas; growing a mechanical release layer on the growth substrate; growing a set of nitride-based LED devices on the mechanical release layer; individually selecting a nitride-based LED device from the set of nitride-based LED devices; releasing the selected nitride-based LED device from the growth substrate; and transferring the selected nitride-based LED device to a receiving substrate.

In any of the embodiments disclosed herein, the growth substrate can be a sapphire wafer.

In any of the embodiments disclosed herein, the growth substrate can have a diameter of between approximately two inches and six inches.

In any of the embodiments disclosed herein, the growth substrate can be reusable.

In any of the embodiments disclosed herein, the growth substrate can be subdivided into a plurality of delimited areas using a grid.

In any of the embodiments disclosed herein, the grid can include dielectric material.

In any of the embodiments disclosed herein, the grid can include silicon dioxide.

In any of the embodiments disclosed herein, the grid can have a thickness of between approximately 100 nanometers and approximately 500 nanometers.

In any of the embodiments disclosed herein, each of the delimited areas of the plurality of delimited areas can have an area of between approximately one micron squared and approximately one centimeter squared.

In any of the embodiments disclosed herein, the area of each of the delimited areas of the plurality of delimited areas can be equal.

In any of the embodiments disclosed herein, each of the delimited areas of the plurality of delimited areas can have a square cross-section.

In any of the embodiments disclosed herein, the mechanical release layer can include h-BN.

In any of the embodiments disclosed herein, the mechanical release layer can have a thickness of between approximately three nanometers and approximately twenty nanometers.

In any of the embodiments disclosed herein, growing the mechanical release layer on the growth substrate can occur in a metal-organic chemical vapor deposition growth chamber.

In any of the embodiments disclosed herein, growing the mechanical release layer on the growth substrate can occur at a temperature of between approximately 1000° C. to approximately 1400° C.

In any of the embodiments disclosed herein, the mechanical release layer can laterally grow on the growth substrate.

In any of the embodiments disclosed herein, growing the set of nitride-based LED devices can include growing a nucleation layer on top of the mechanical release layer; growing an n-layer on top of the nucleation layer; positioning a plurality of quantum wells on top of the n-layer; and growing a p-layer on top of the plurality of quantum wells.

In any of the embodiments disclosed herein, the nucleation layer can include aluminum gallium nitride.

In any of the embodiments disclosed herein, the nucleation layer can have a thickness of approximately 250 nanometers.

In any of the embodiments disclosed herein, the n-layer can have a thickness of approximately 500 nanometers.

In any of the embodiments disclosed herein, the n-layer can include gallium nitride.

In any of the embodiments disclosed herein, the gallium nitride of the n-layer can be doped with silicon.

In any of the embodiments disclosed herein, the plurality of quantum wells can include one or more periods, each period including a barrier layer and a quantum well layer.

In any of the embodiments disclosed herein, the plurality of quantum wells can include five periods.

In any of the embodiments disclosed herein, the barrier layer can include gallium nitride.

In any of the embodiments disclosed herein, the barrier layer can include alloys of gallium nitride, including, but not limited to, AlGaN and InGaN.

In any of the embodiments disclosed herein, the barrier layer can have a thickness of between approximately ten nanometers and approximately twenty nanometers.

In any of the embodiments disclosed herein, the quantum well layer can include indium gallium nitride.

In any of the embodiments disclosed herein, the quantum well layer can have a thickness of between approximately two nanometers and approximately four nanometers.

In any of the embodiments disclosed herein, the p-layer can have a thickness of approximate 250 nanometers.

In any of the embodiments disclosed herein, the p-layer can include gallium nitride.

In any of the embodiments disclosed herein, the gallium nitride of the p-layer can be doped with magnesium.

In any of the embodiments disclosed herein, the set of nitride-based LED devices can include one or more nitride-based devices, each nitride-based LED device being grown in a delimited area of the plurality of delimited areas.

In any of the embodiments disclosed herein, releasing the selected nitride-based LED device can include positioning a liquid dissolvable tape on a support of a device capable of moving linearly with respect to a vertical axis; lowering the support such that the liquid dissolvable tape contacts the selected nitride-based LED device; affixing the selected nitride-based LED device to the liquid dissolvable tape; and removing the selected nitride-based LED device from the growth substrate by vertically lifting the support.

In any of the embodiments disclosed herein, the liquid dissolvable tape can be water dissolvable.

In any of the embodiments disclosed herein, the liquid dissolvable tape can dissolve in water within approximately one minute.

In any of the embodiments disclosed herein, releasing the selected nitride-based LED device can include dissolving the liquid dissolvable tape from the nitride-based LED device after the selected nitride-based LED device is transferred to the receiving substrate.

In any of the embodiments disclosed herein, the receiving substrate can be a flexible metallic tape.

In any of the embodiments disclosed herein, the receiving substrate can be a flexible aluminum tape.

In any of the embodiments disclosed herein, the selected nitride-based LED device can remain substantially intact when transferring the selected nitride-based LED device to the receiving substrate.

In any of the embodiments disclosed, herein the selected nitride-based LED device can remain free of cracks or fractures when transferring the selected nitride-based LED device to the receiving substrate.

In any of the embodiments disclosed herein, the selected nitride-based LED device can be transferred to the receiving substrate such that a p-layer of the selected nitride-based LED device is facing upward.

In any of the embodiments disclosed herein, the selected nitride-based LED device can exhibit a blue light emission of between approximately 400 nanometers and approximately 450 nanometers.

In any of the embodiments disclosed herein, the method of growing and releasing nitride-based LED devices can further include transferring the selected nitride-based LED device to an integrated circuit.

The disclosed technology can also include a nitride-based LED device made by a method according to any of the embodiments disclosed herein.

These and other aspects of the present invention are described in the Detailed Description below and the accompanying figures. Other aspects and features of embodiments of the present invention will become apparent to those of ordinary skill in the art upon reviewing the following description of specific, exemplary embodiments of the present invention in concert with the figures. While features of the present invention may be discussed relative to certain embodiments and figures, all embodiments of the present invention can include one or more of the features discussed herein. Further, while one or more embodiments may be discussed as having certain advantageous features, one or more of such features may also be used with the various embodiments of the invention discussed herein. In similar fashion, while exemplary embodiments may be discussed below as device, system, or method embodiments, it is to be understood that such exemplary embodiments can be implemented in various devices, systems, and methods of the present invention

BRIEF DESCRIPTION OF THE FIGURES

Reference will now be made to the accompanying figures, which are not necessarily drawn to scale, and wherein.

DETAILED DESCRIPTION

Figure 1:
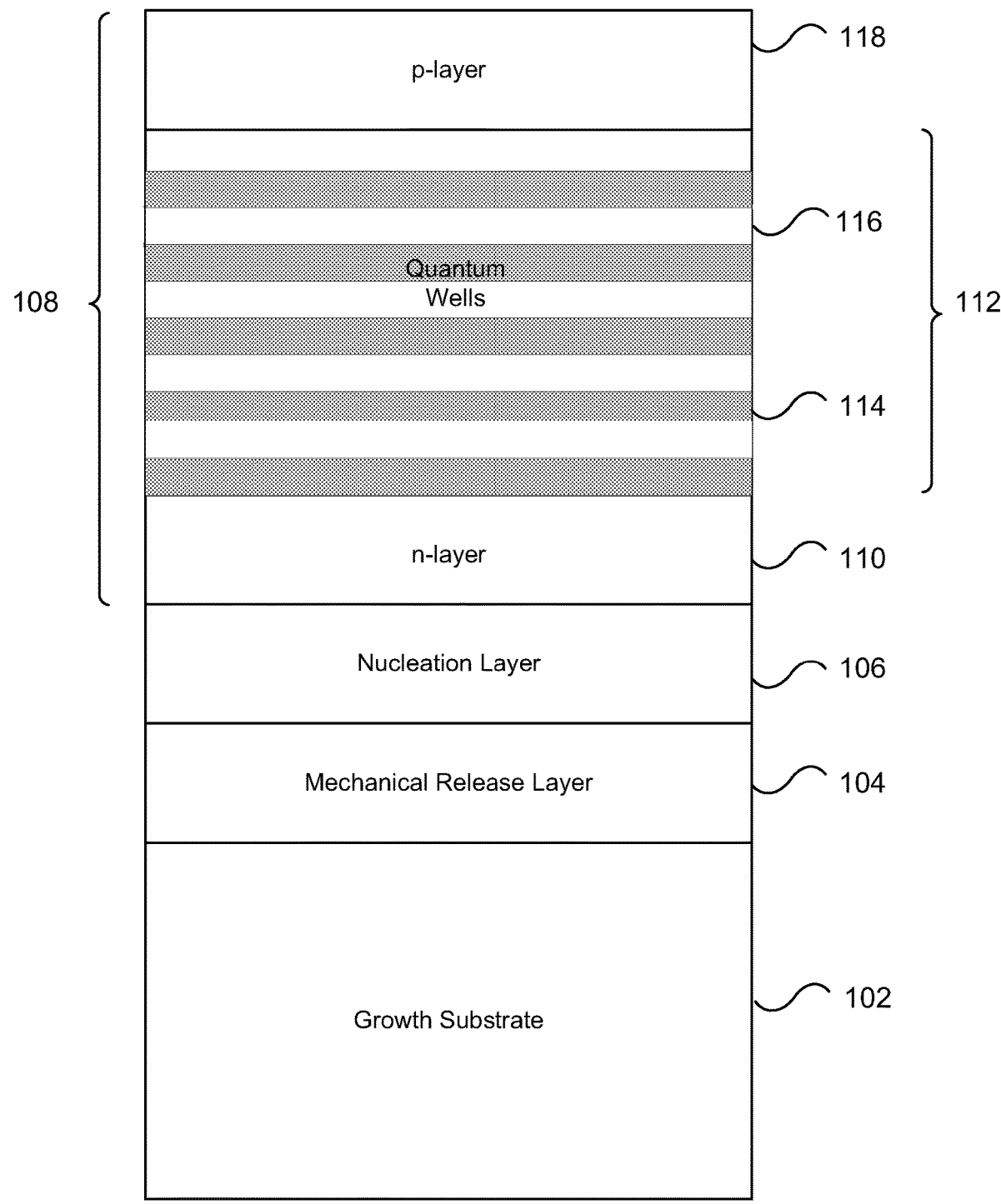
FIG. 1 is a diagram of a growth substrate including a nitride-based LED device, according to some aspects of the present disclosure.

The disclosed technology relates to a method of growing nitride-based LED devices on a growth substrate and transferring an individually selected nitride-based LED device to a receiving substrate. The method can include subdividing the growth substrate into delimited areas using a patterned grid. A mechanical release layer can be grown on the growth substrate. A set of nitride-based LED devices can be grown on the mechanical release layer, such that a nitride-based LED device can be grown in each delimited area. An individual nitride-based LED device can be selected and released from the growth substrate. The selected nitride-based LED device can then be transferred to the receiving substrate.

The disclosed technology will be described more fully hereinafter with reference to the accompanying drawings. This disclosed technology can, however, be embodied in many different forms and should not be construed as limited to the examples set forth herein. The components described hereinafter as making up various elements of the disclosed technology are intended to be illustrative and not restrictive. Many suitable components that would perform the same or similar functions as components described herein are intended to be embraced within the scope of the disclosed electronic devices and methods. Such other components not described herein may include, but are not limited to, for example, components developed after development of the disclosed technology.

In the following description, numerous specific details are set forth. But it is to be understood that examples of the disclosed technology can be practiced without these specific details. In other instances, well-known methods, structures, and techniques have not been shown in detail in order not to obscure an understanding of this description. References to "one embodiment," "an embodiment," "example embodiment," "some embodiments," "certain embodiments," "various embodiments," etc., indicate that the embodiment(s) of the disclosed technology so described may include a particular feature, structure, or characteristic, but not every embodiment necessarily includes the particular feature, structure, or characteristic. Further, repeated use of the phrase "in one embodiment" does not necessarily refer to the same embodiment, although it may.

Throughout the specification and the claims, the following terms take at least the meanings explicitly associated herein, unless the context clearly dictates otherwise. The term "or" is intended to mean an inclusive "or." Further, the terms "a," "an," and "the" are intended to mean one or more unless specified otherwise or clear from the context to be directed to a singular form.

Unless otherwise specified, the use of the ordinal adjectives "first," "second," "third," etc., to describe a common object, merely indicate that different instances of like objects are being referred to, and are not intended to imply that the objects so described should be in a given sequence, either temporally, spatially, in ranking, or in any other manner.

FIG. 1 is a diagram of a growth substrate 102 including grown nitride-based LED devices 108. The nitride-based LED devices 108 can include group III nitride compositions, including aluminum nitride, gallium nitride, and indium nitride, and various combinations thereof. Group III nitrides can have advantageous physical properties that allow these compositions to be used in microelectronics and optoelectronics. These physical properties can include, a wide bandgap, high saturated drift rate, high breakdown voltage, high thermal conductivity, and chemical and thermal stability.

A mechanical release layer 104 can be grown on the growth substrate 102. A nucleation layer 106 can be grown on the mechanical release layer 104. The nitride-based LED devices 108 can be grown on the nucleation layer 106. The nitride-based LED devices 108 can include an n-layer 110, a plurality of quantum wells 112, and a p-layer 118. The plurality of quantum wells 112 can include alternating barrier layers 114 and quantum well layers 116.

Figure 2A:
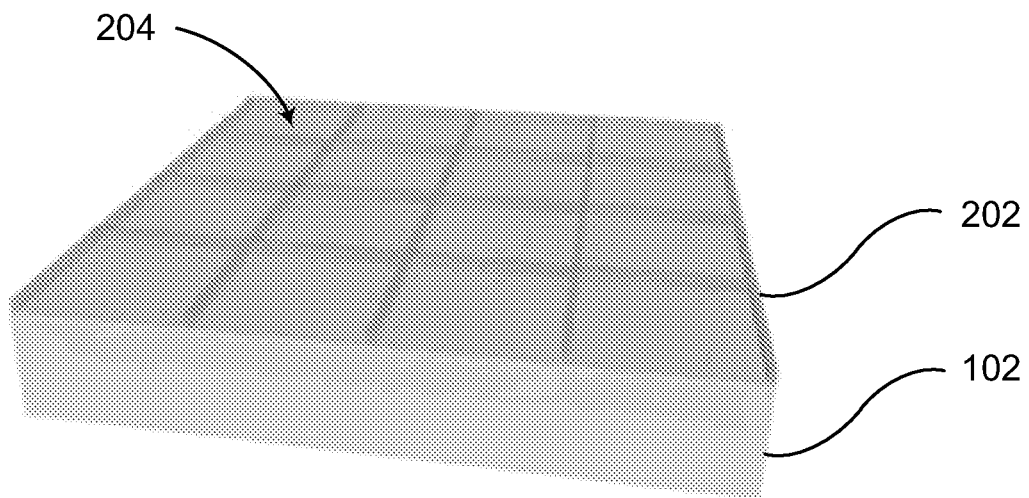
FIGS. 2A and 2B are illustrations of a growth substrate subdivided into delimited areas, according to some aspects of the present disclosure.
Figure 2B:
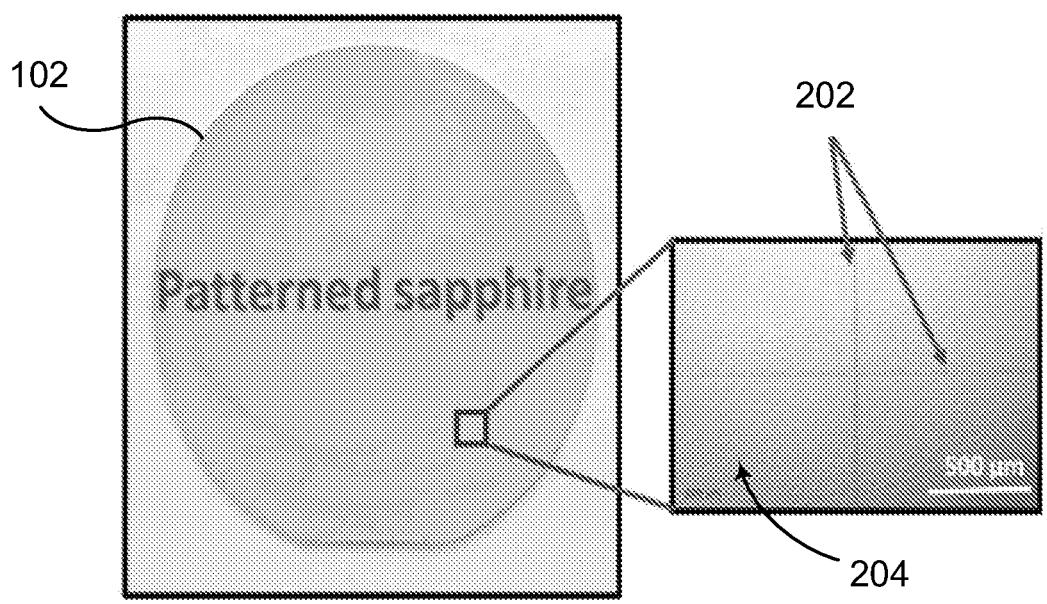

FIGS. 2A and 2B illustrate an example growth substrate 102. The growth substrate 102 can be any growth substrate in which the mechanical release layer can grow upon. In some embodiments, the growth substrate 102 can be a sapphire wafer. In some embodiments, the growth substrate 102 can be silicon, silicon carbide, or diamond. The growth substrate 102 can have a diameter of approximately two inches and approximately six inches. In some embodiments, the diameter of the growth substrate 102 can only be limited by the diameter of commercially available growth substrates 102. The growth substrate 102 can be any shape. In some embodiments, the growth substrate 102 can have a square cross-section, as illustrated in FIG. 2A. In some embodiments the growth substrate 102 can have a substantially circular cross-section, as illustrated in FIG. 2B. The growth substrate 102 can be subdivided into a plurality of delimited areas 204 using a grid 202. In some embodiments, the grid 202 can comprise silicon dioxide ("SiO$_2$"). In some embodiments, the grid 202 can comprise silicon nitride or any other dielectric material. The grid 202 can have a thickness of between approximately 100 nanometers and approximately 500 nanometers. The grid 202 can enable separation of the nitride-based LED devices 108 grown and can facilitate a scalable device-by-device, pick-and-place technique without the need for a dicing step.

Each of the delimited areas 204 can define an area in which a nitride-based LED device 108 can be grown. The area of each of the delimited areas 204 can be between approximately one micron squared and approximately one centimeter squared. In some embodiments, the area of each of the delimited areas 204 can be based on a desired area of the nitride-based LED device 108. In some embodiments, the area of each of the delimited areas 204 can be less than one micron squared. In some embodiments, the area of each of the delimited areas 204 can be any area in which no delamination occurs. In some embodiments, the area of each of the delimited areas 204 can be the same. Alternatively, a first delimited area can have a different area than a second delimited area. Each delimited area 204 can have any shape cross-section, including a square cross-section, a circular cross-section, or a polygonal cross-section. In some embodiments, the delimited areas 204 can have a shape corresponding to a shape of the subsequently grown nitride-based LED device 108. The grid 202 can subdivide the growth substrate 102 into any number of delimited areas 204. In some embodiments, the number of delimited areas 204 can be based on a desired number of nitride-based LED devices 108. In some embodiments, the number of delimited areas 204 can be between approximately 12 and 20.

FIG. 2B is an optical microscope image of the growth substrate 102 subdivided into delimited areas 204 by the grid 202. Within each delimited area 204 of the growth substrate 102, a nitride-based LED device 108 can be grown. The grid 202 can allow each grown nitride-based LED device 108 to be physically insulated from each other, such that release and transfer of the nitride-based LED devices 108 can be completed with ease. Accordingly, the method of fabricating and subsequently releasing and transferring nitride-based LED devices can be increased in scale to industrial levels. Although, FIGS. 2A and 2B illustrate one example pattern produced by the grid 202, it is contemplated that any pattern can be produced by a corresponding patterned grid 202.

Figure 3:
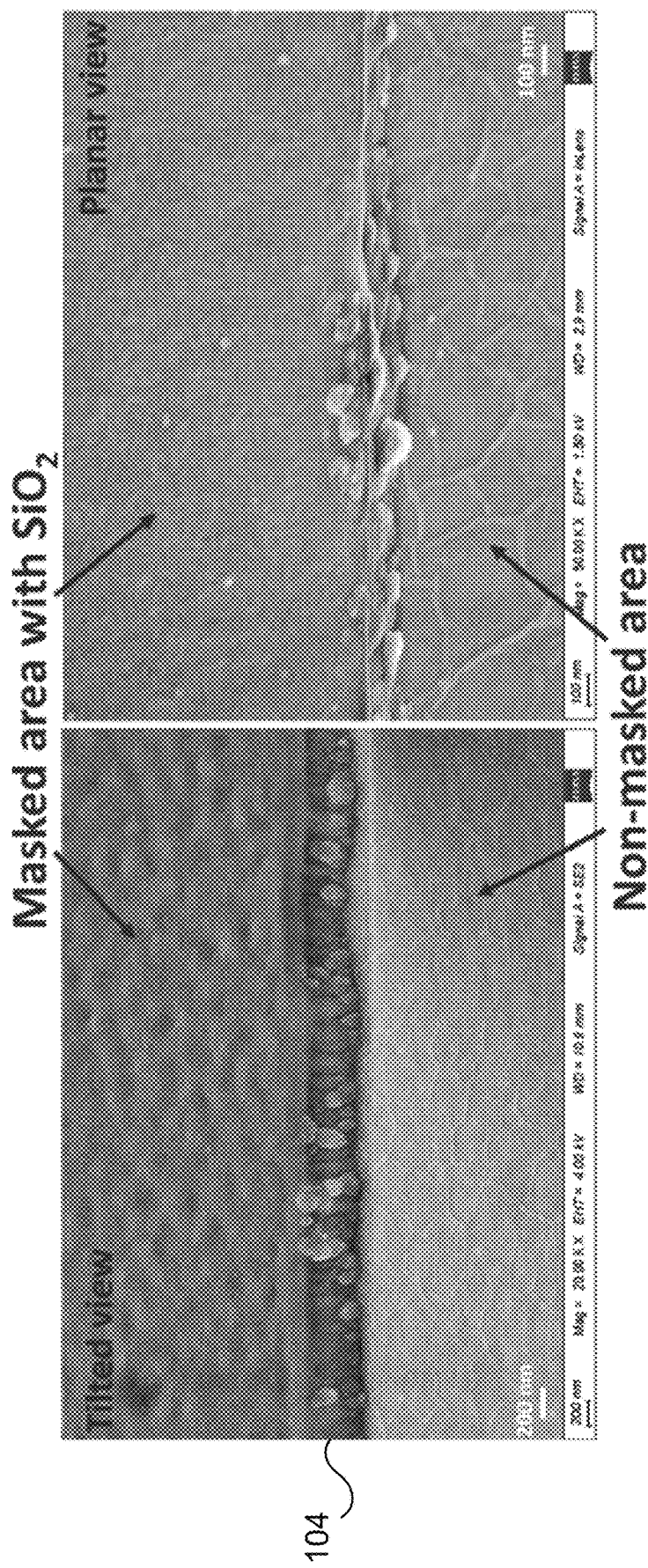
FIG. 3 is a scanning electron microscope (SEM) image of a mechanical release layer grown on a growth substrate, according to some aspects of the present disclosure.

FIG. 3 illustrates a scanning electron microscope (SEM) image of the mechanical release layer 104 grown on the growth substrate 102 from a tilted and planar perspective. The mechanical release layer 104 can include hexagonal boron nitride ("h-BN"). The h-BN mechanical release layer 104 can laterally grow such that multiple layers of h-BN can be formed. The layers of h-BN can be stacked together via van der Waals interactions and can be exfoliated into thin 2D layers. The h-BN mechanical release layer 104 can provide an optimized van der Waals surface for which a set of nitride-based LED devices 108 can grow upon. Because van der Waals interactions can be relatively easy to break, an individual nitride-based LED device 108 can be selected from the set of nitride-based LED devices 108, released, and transferred from the growth substrate 102.

The mechanical release layer 104 can be grown to many different thicknesses. In some embodiments, the mechanical release layer 104 can be grown to a thickness of between approximately 3 nanometers and approximately 20 nanometers. The mechanical release layer 104 can be grown on the growth substrate 102 within a metal-organic chemical vapor deposition growth chamber of any size. The mechanical release layer 104 can be grown on the growth substrate 102 at a temperature of between approximately 1000° C. to approximately 1400° C.

The growth of the mechanical release layer 104 can be localized, such that the mechanical release layer 104 can grow at a first growth rate on the growth substrate 102 and the mechanical release layer 104 can grow at a second growth rate on the grid 202. The first growth rate can be greater than the second growth rate. The mechanical release layer 104 grown directly on the growth substrate 102 can be a high-quality, laterally grown, h-BN layer. Portions of the mechanical release layer 104 grown on the grid 202 can include randomly oriented BN. The randomly oriented boron nitride can reduce the quality of the h-BN mechanical release layer 104 as compared to the h-BN mechanical release layer 104 grown laterally on the growth substrate 102. In some embodiments, the second growth rate can be insubstantial. In this configuration, the mechanical release layer 104 can be insubstantially present on the grid 202.

Figure 4A:
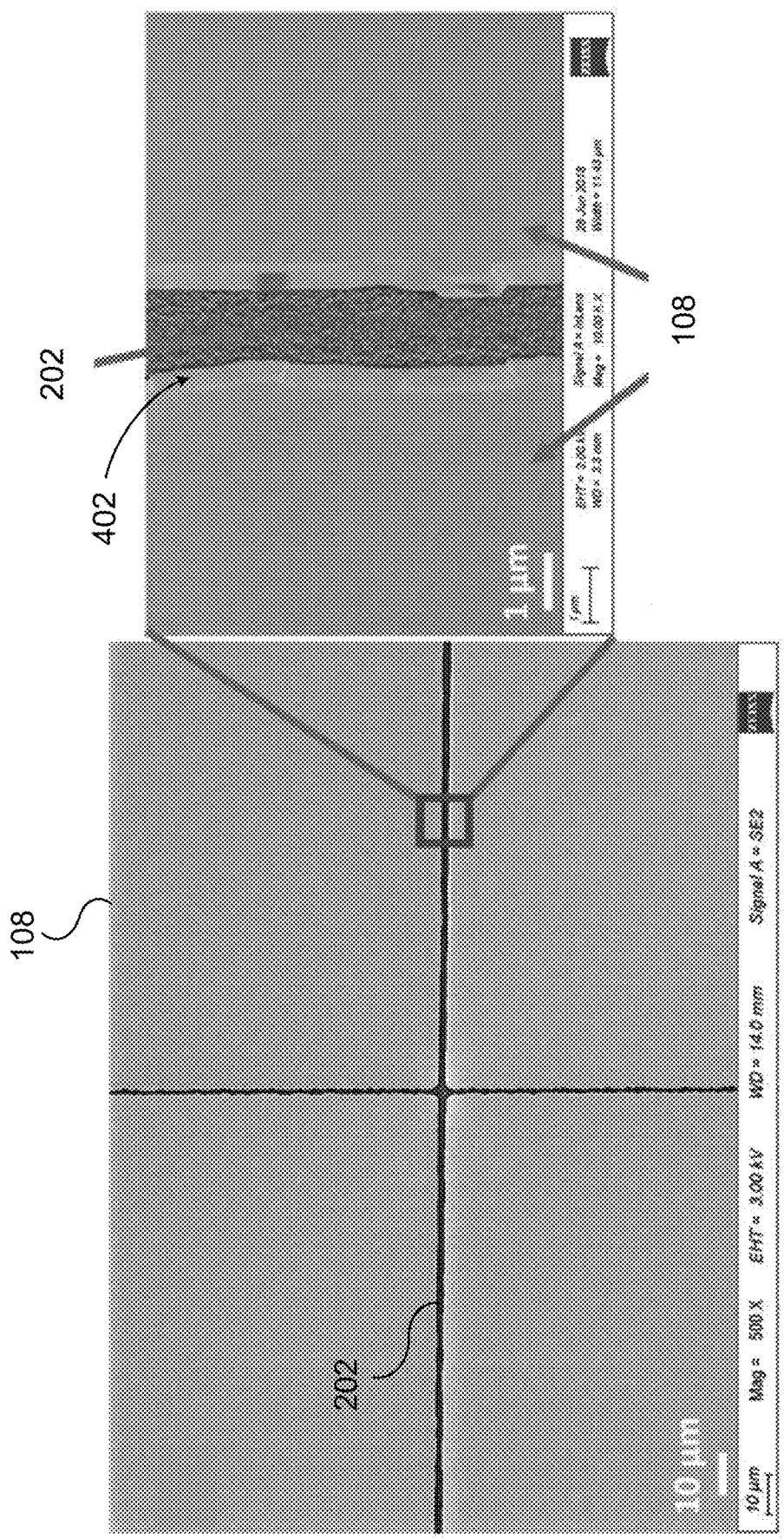
FIG. 4A is a SEM image of nitride-based LED devices, according to some aspects of the present disclosure.

FIG. 4A illustrates the growth of the nitride-based LED devices 108 on the growth substrate 102. To grow the nitride-based LED devices 108 a nucleation layer 106 can first be grown on the mechanical release layer 104. The nucleation layer 106 can comprise aluminum-gallium-nitride ("AlGaN"). In some embodiments, the nucleation layer 106 can comprise AlGaN having an aluminum mole fraction of approximately 14%. In some embodiments, the nucleation layer 106 can have a thickness of approximately 250 nanometers.

The nitride-based LED devices 108 can be grown on the nucleation layer 106. The nitride-based LED devices 108 can include an n-layer 110, a plurality of quantum wells 112, and a p-layer 118. The n-layer 110 can be grown on the nucleation layer 106. The n-layer 110 can include gallium nitride ("GaN"). In some embodiments, the GaN of the n-layer 110 can be doped with silicon, sulfur, or any other n-doping material. The n-layer 110 can have a thickness of approximately 500 nanometers. The plurality of quantum wells 112 can include alternating barrier layers 114 and quantum well layers 116. The barrier layers 114 and the quantum well layer 116 can extend longitudinally and can be substantially parallel to one another. The barrier layers 114 can include GaN. Each barrier layer 114 can have a thickness of between approximately 10 nanometers and approximately 20 nanometers. The quantum well layers 116 can include indium gallium nitride ("InGaN"), aluminum gallium nitride ("AlGaN"), or any combination of AlGaInN. In some embodiments, the composition chosen for the quantum well layers 116 can be based on the desired light emitting characteristics of the nitride-based LED device 108. By way of example, when the quantum well layers 116 include AlGaN, the nitride-based LED device 108 can emit ultraviolet light, and when the quantum well layers 116 include AlGaInN, the nitride-based LED device 108 can emit light within a range from visible light to deep ultraviolet light. Each quantum well layer 116 can have a thickness of between approximately 2 nanometers and approximately 4 nanometers. The plurality of quantum wells 112 can include any number of alternating barrier layers 114 and quantum well layer 116, with one barrier layer 114 and an adjacent quantum well layer 116 being defined as a period. In some embodiments, the plurality of quantum wells 112 can include five periods, such that there are five alternating barrier layers 114 and quantum well layers 116, as illustrated in FIG. 1. The p-layer 114 of the nitride-based device 108 can be grown above the plurality of quantum wells 112. The p-layer 114 can have a thickness of approximately 250 nanometers. The p-layer 114 can comprise GaN. In some embodiments, the GaN of the p-layer 118 can be doped with magnesium.

As illustrated in FIG. 4A, the nitride-based LED devices 108 can avoid growing on the grid 202. In this sense, the nitride-based LED devices 108 can be selectively grown in regions where layered h-BN is deposited and can avoid growing on randomly oriented BN on the silicon dioxide grid 202. By not readily growing on the grid 202, the nitride-based LED devices 108 can have sharp side walls 402 along each side of the grid 202. In this configuration, the nitride-based LED devices 108 can be easily separated and released after fabrication.

Figure 4B:
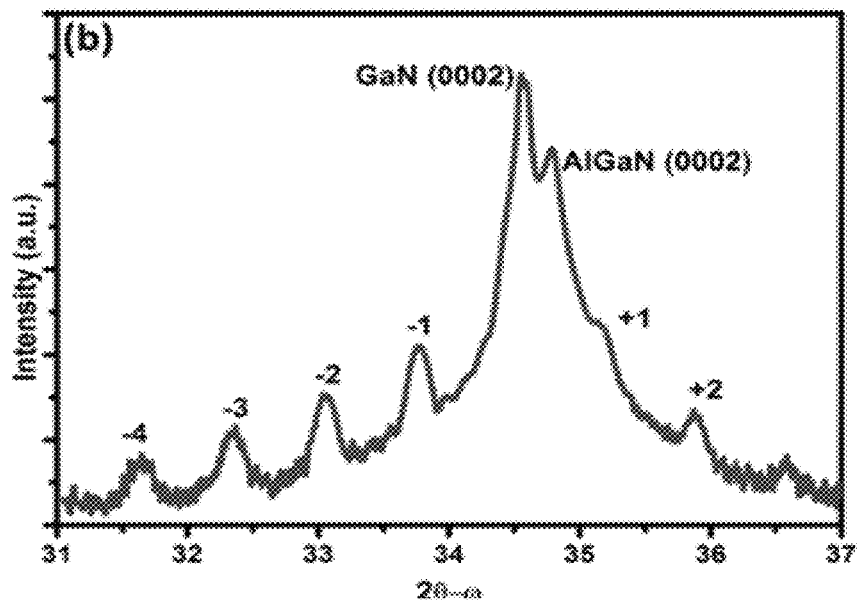
FIG. 4B is a high-resolution diffraction scan of a nitride-based LED device, according to some aspects of the present disclosure.

FIG. 4B illustrates a high-resolution X-ray diffraction scan of the grown nitride-based LED devices 108. The scan illustrates the nitride-based LED device 108 can peak up to the fourth order. The scan also illustrates peaks from the GaN n-layer 110 and the GaN p-layer 118, and the AlGaN nucleation layer 106.

Figure 4C:
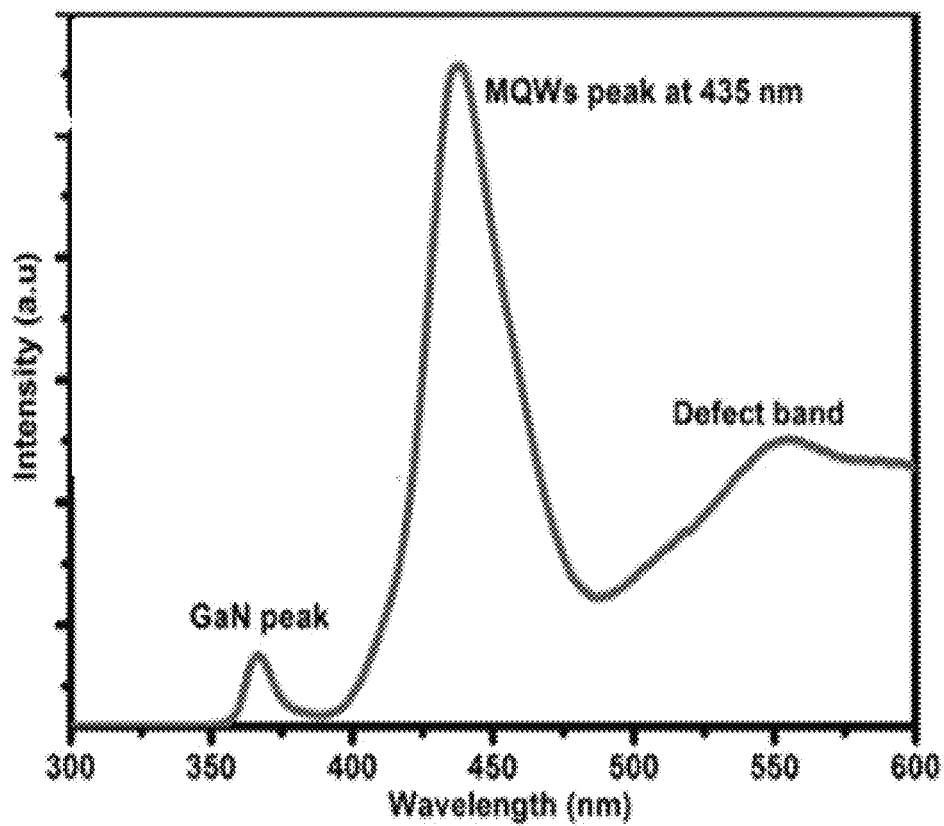
FIG. 4C is a cathodoluminescence spectrum for a nitride-based LED device, according to some aspects of the present disclosure.

FIG. 4C illustrates a cathodoluminescence spectrum for the plurality of quantum wells 112 at room temperature with an electron beam excitation energy of 5 keV. An emission peak produced by the plurality of quantum wells 112 can occur around approximately 435 nanometers. This emission peak can correspond to approximately 14% Indium content in the quantum wells 112.

The characteristics of the nitride-based LED devices 108 as illustrated in FIGS. 4A through 4C can confirm the ability to selectively grow InGaN-based LED devices 108 on a van der Waals surface with high quality using a growth substrate 102 including a sapphire wafer.

Figure 5A:
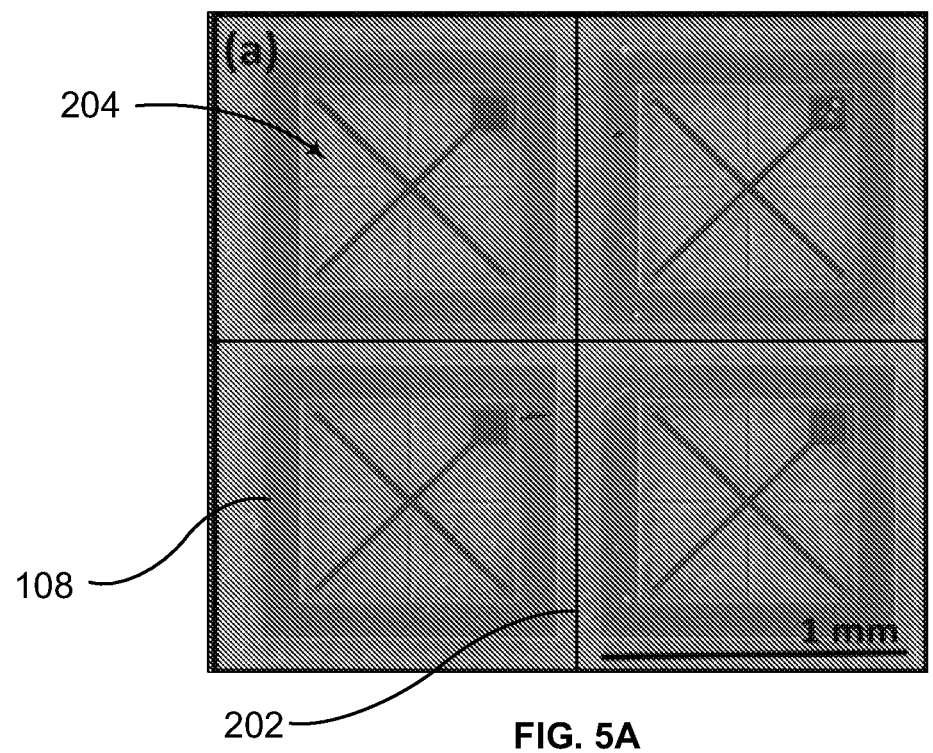
FIGS. 5A and 5B are optical microscope images of nitride-based LED devices, according to some aspects of the present disclosure.
Figure 5B:
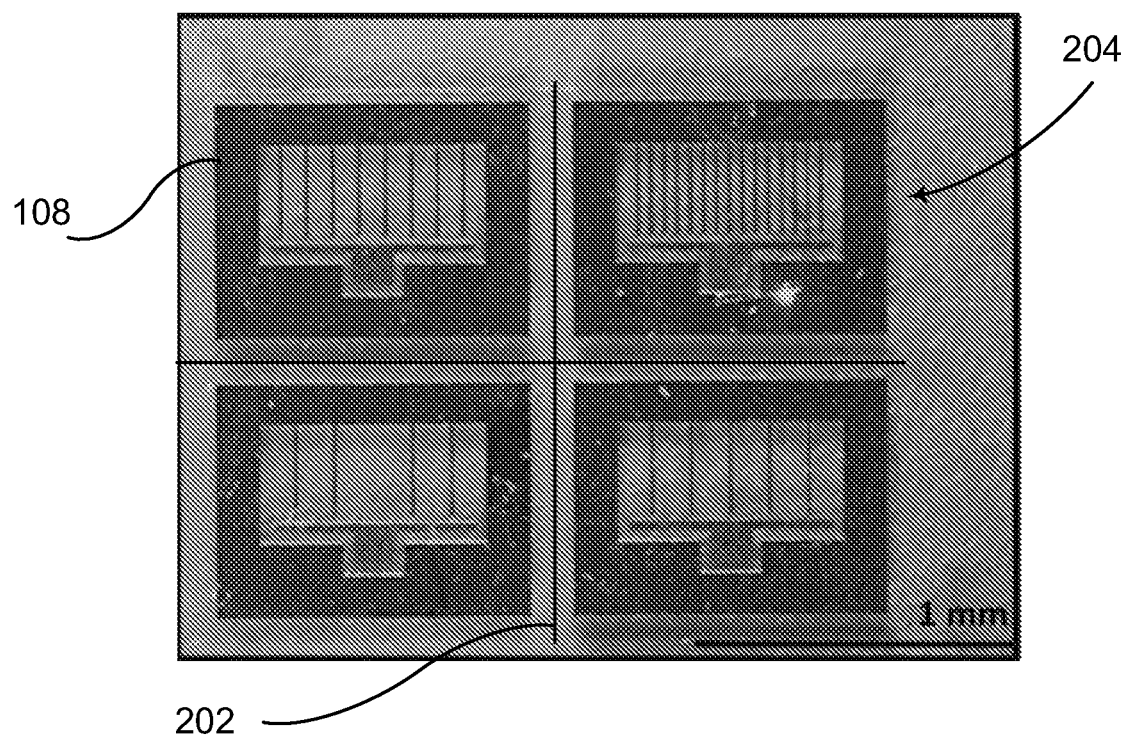

FIGS. 5A and 5B are optical microscope images of example grown nitride-based LED devices 108. FIGS. 5A and 5B illustrates a portion of the growth substrate 102 subdivided into four delimited areas 204 by the grid 202. Within each delimited area 204, a nitride-based LED device 108 can be grown. Each nitride-based LED device 108 can have an area of approximately one millimeter squared. The nitride-based LED devices 108 illustrated in FIGS. 5A and 5B have different designs, indicating the variability in design of grown nitride-based LED devices 108.

Figure 6:
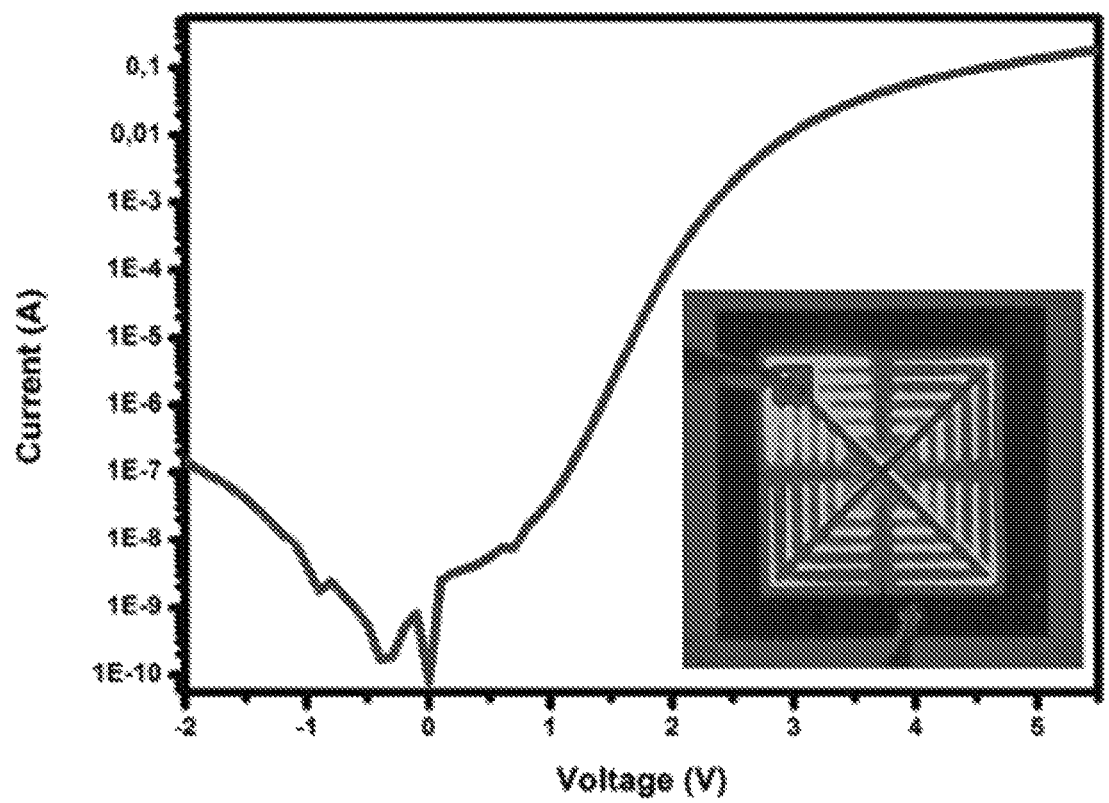
FIG. 6 is a graphical representation of current and voltage of a nitride-based LED device, according to some aspects of the present disclosure.

FIG. 6 is a graphical representation of current and voltage of the nitride-based LED device 108. The current and voltage measurements of the nitride-based LED device 108 indicate the nitride-based LED device 108 can emit blue light emission.

Figure 7A:
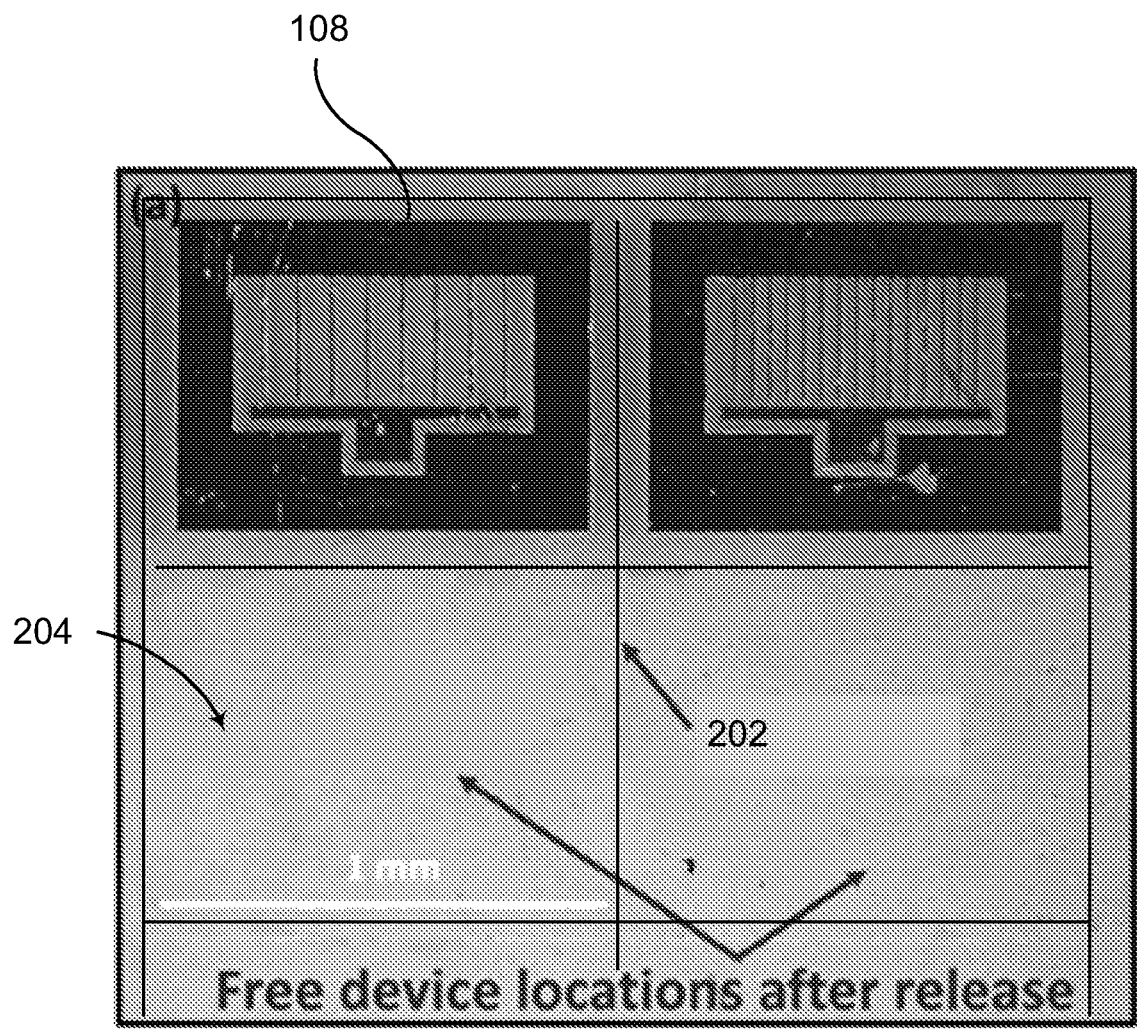
FIGS. 7A-7C are images of selectively releasing and transferring nitride-based LED devices from a growth substrate, according to some aspects of the present disclosure.
Figure 7C:
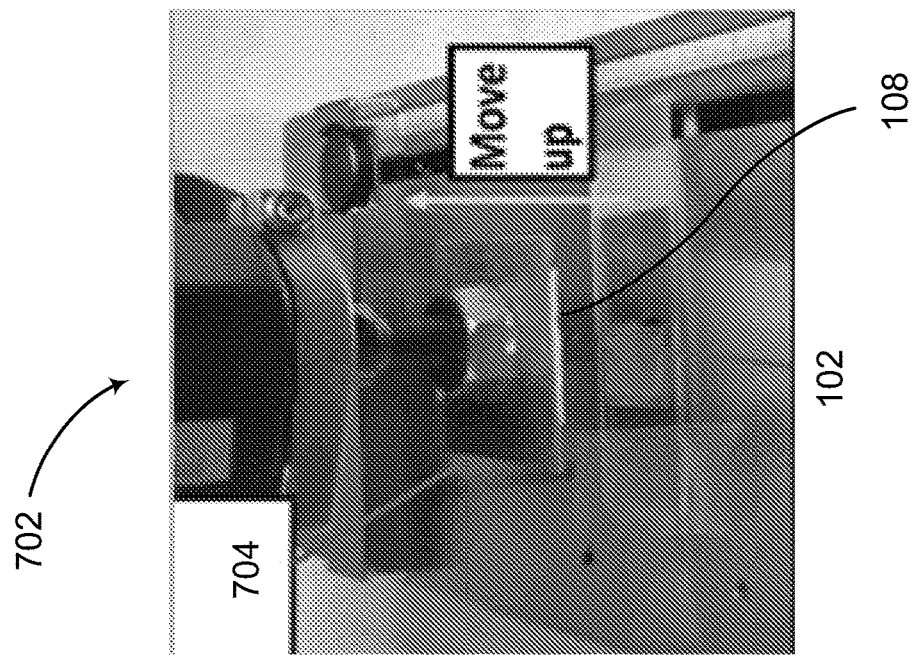
Figure 7B:
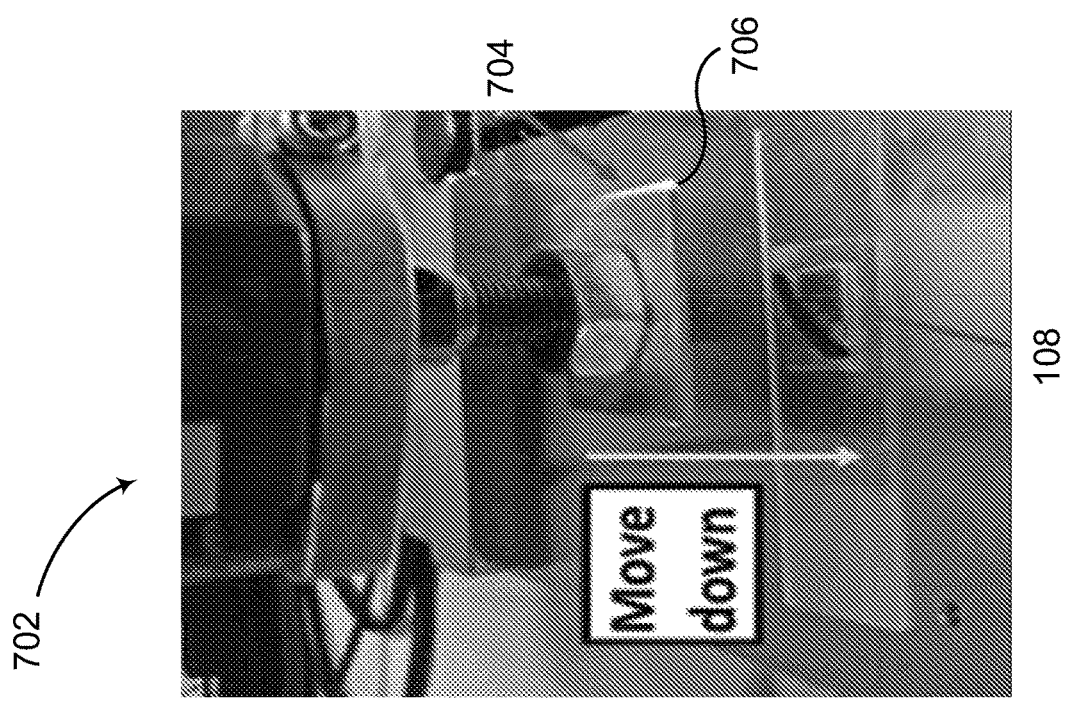

FIGS. 7A through 7C illustrate the release of an individually selected nitride-based LED device 108 from the growth substrate 102 after the nitride-based LED devices 108 are grown. Because the grid 202 physically insulates each nitride-based LED device 108 from each other, each nitride-based LED device 108 can be released and transferred to a receiving substrate 802 without the need for a dicing step. FIG. 7A illustrates this pick-and-place capability, as two of the four nitride-based LED devices 108 have been released and transferred, while two of the four nitride-based LED devices 108 remain on the growth substrate 102.

During the transfer process, the selected nitride-based LED devices 108 can remain completely intact and free from cracks, metallic contact damage, or other forms of delamination. This delamination-free transfer can be achieved primarily through optimized vertical liftoff of the LED devices 108, using a set-up as illustrated in FIGS. 7B and 7C. The set-up can include a mechanically driven release device 702 that enables linear movement with respect to a vertical axis. By removing the selected nitride-based LED device 108 from the growth substrate 102 using only vertical movement, the nitride-based LED device 108 can avoid being peeled off, resulting in the potential for strains leading to cracks on the surface of the LED devices 108 to be minimized.

The release device 702 can include a support 704. A liquid dissolvable tape 706 can be affixed to the support 704. In some embodiments, the liquid dissolvable tape 706 can be water dissolvable. The support 704 with the liquid soluble tape 706 can be lowered such that the tape 706 can contact the nitride-based LED device 108, as illustrated in FIG. 7B. Upon contact, the liquid dissolvable tape 706 and the nitride-based LED device 108 can be flush with each other, such that the LED device 108 can be vertically released from the growth substrate 102 without peeling. As illustrated in FIG. 7C, once the liquid dissolvable tape 706 and the nitride-based LED device 108 are securely affixed to each other, the support 704 can be vertically lifted. As the support 704 is vertically lifted, the nitride-based LED device 108 can be released from the growth substrate 102. In some embodiments, a hard carrier, resist, or polydimethylsiloxane ("PDMS") can be substituted for the liquid soluble tape 706, and can be used to release the nitride-based LED device 108 from the growth substrate 102.

Figure 8A:
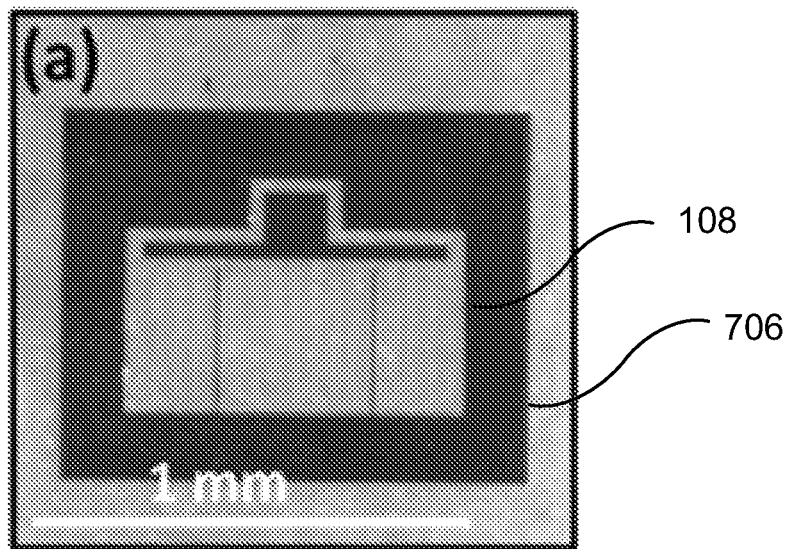
FIG. 8A is a microscope image of a nitride-based LED device released from a growth substrate, according to some aspects of the present disclosure.
Figure 8B:
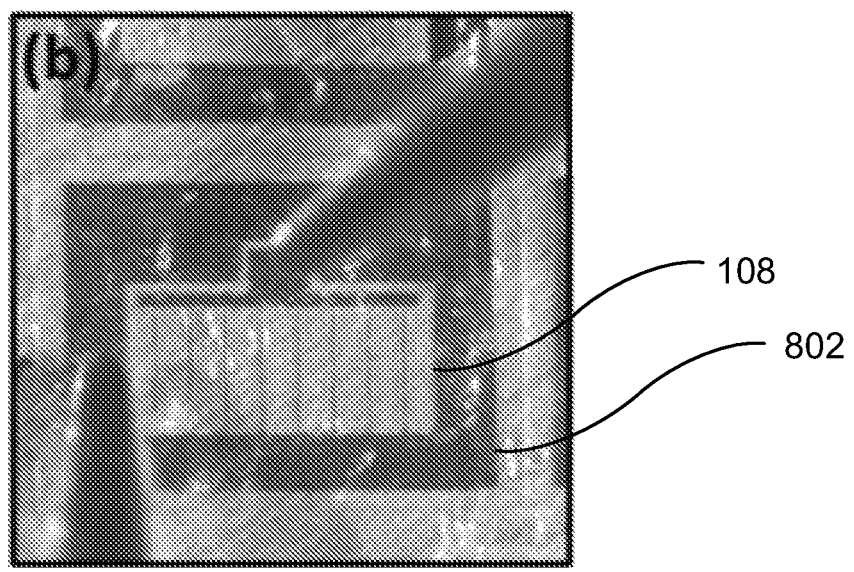
FIG. 8B is a microscope image of a nitride-based LED device transferred to a receiving substrate, according to some aspects of the present disclosure.
Figure 8C:
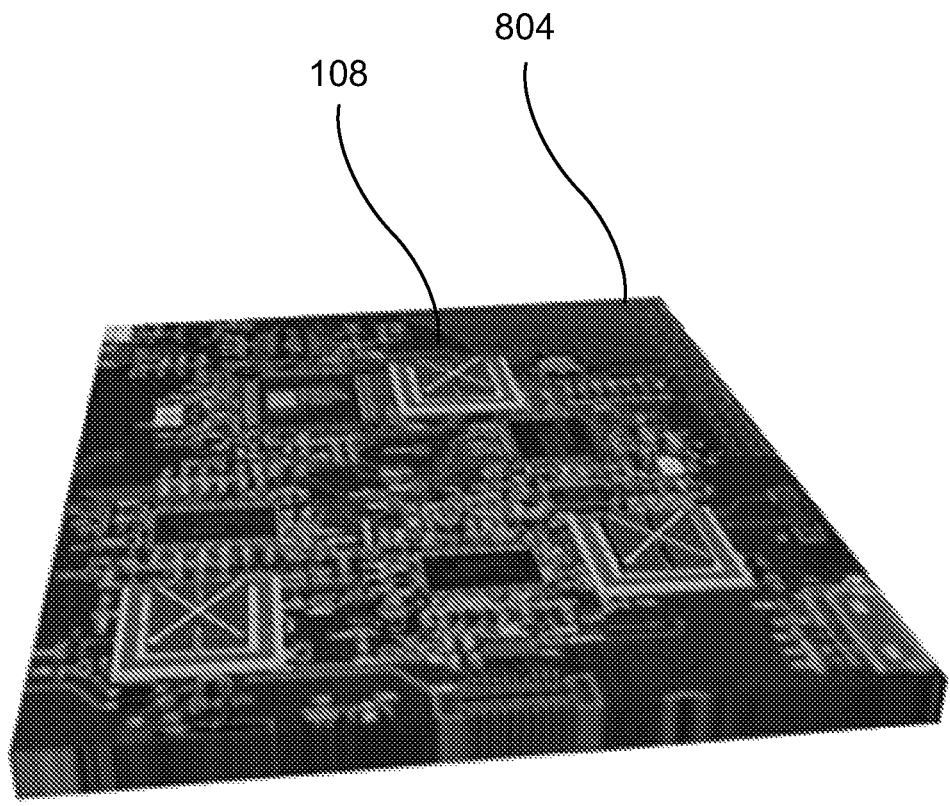
FIG. 8C is an illustration of a nitride-based LED device transferred to an integrated circuit, according to some aspects of the present disclosure.

FIGS. 8A and 8B are microscope images of the selected nitride-based LED device 108 being transferred to a receiving substrate 802 after release from the growth substrate 102. FIG. 8A is a microscope image of a back-side of the nitride-based LED device 108 on the liquid dissolvable tape 706 after release from the growth substrate 102. FIG. 8B is a microscope image of the nitride-based LED device 108 transferred to a receiving substrate 802 without any damage, cracks, fractures or other forms of spontaneous delamination. In some embodiments, the receiving substrate 802 can be a flexible metallic tape, including flexible aluminum tape and flexible copper tape. In some embodiments, the nitride-based LED device 108 can be transferred to the receiving substrate 802 such that the p-layer 118 is facing upwards. Alternatively, in some embodiments, the nitride-based LED device 108 can be placed up-side down in contact with an IC driver. In this configuration, an additional transfer step after the LED device 108 is released can be implemented. Once the nitride-based LED device 108 has been successfully transferred to the receiving substrate 802, the liquid dissolvable tape 706 can be dissolved. In some embodiments, the liquid dissolvable tape 706 can be removed by dissolving in water for approximately one minute. FIG. 8C illustrates the nitride-based LED device 108 can be further transferred to an integrated circuit 804. After all the nitride-based LED devices 108 grown on the growth substrate 102 have been individually selected, released, and transferred to the receiving substrate 802, the growth substrate 102 can be used again for subsequent growth of additional sets of nitride-based LED devices 108.

Figure 9:
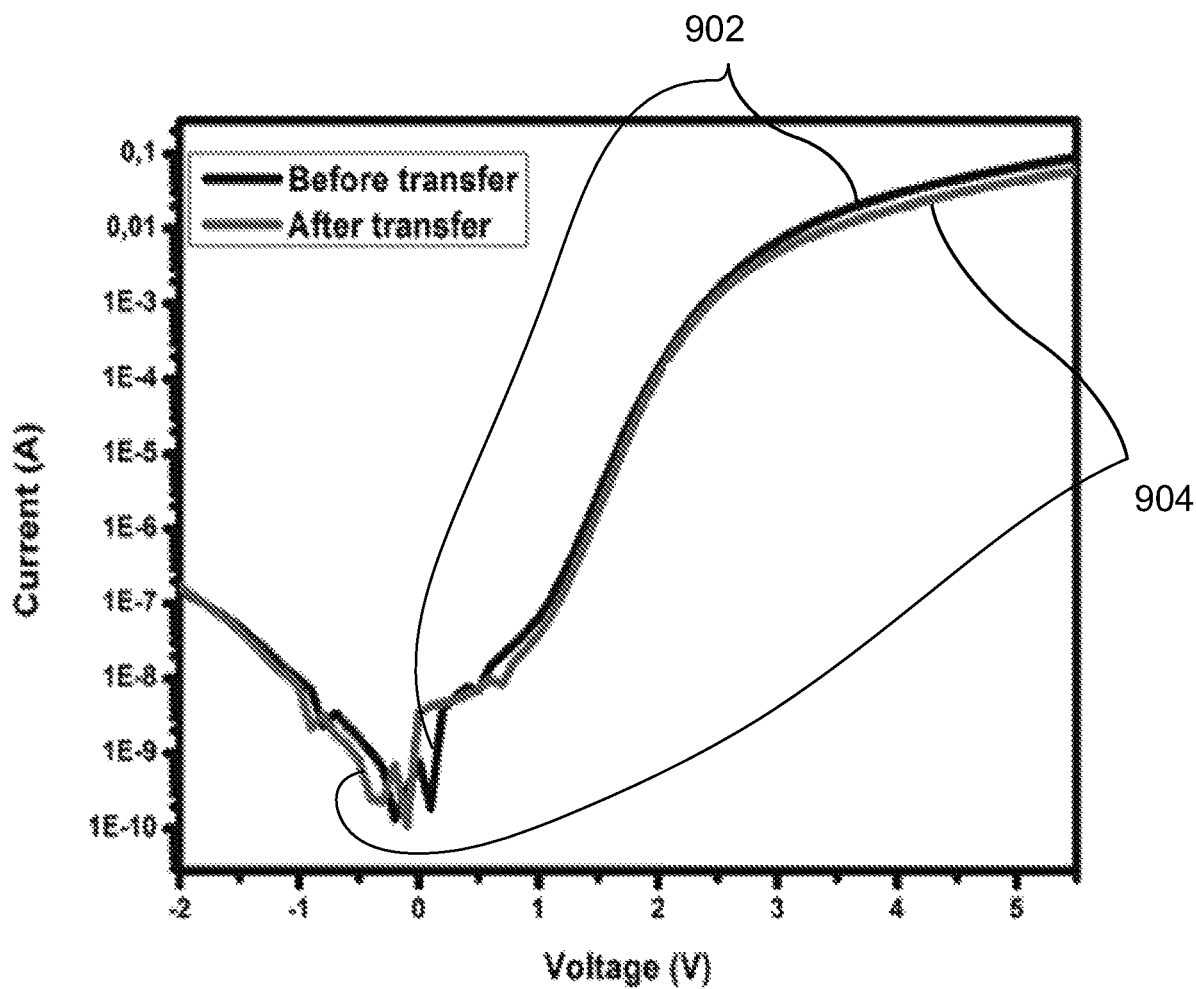
FIG. 9 is a graphical representation of current and voltage of a nitride-based LED device before transfer to a receiving substrate and after transfer to a receiving substrate, according to some aspects of the present disclosure.

FIG. 9 is a graphical representation of current and voltage of an example nitride-based LED device 108 before and after transfer to the receiving substrate 802. As illustrated in FIG. 9, the nitride-based LED device 108 can have substantially similar current and voltage characteristics before transfer 902 and after transfer 904, indicating that during the release and transfer, the LED device 108 does not experience spontaneous delamination. The current and voltage characteristics can also indicate that the transferred example nitride-based LED device 108 can emit blue light emission. Although FIG. 9 depicts an example nitride-based LED device 108 that can emit blue light emission, it is contemplated that any nitride-based LED device 108 can be grown on the growth substrate 102 and transferred to the receiving substrate 802, such that the nitride-based LED device 108 can emit any form of visible light and/or ultraviolet light.

Figure 10:
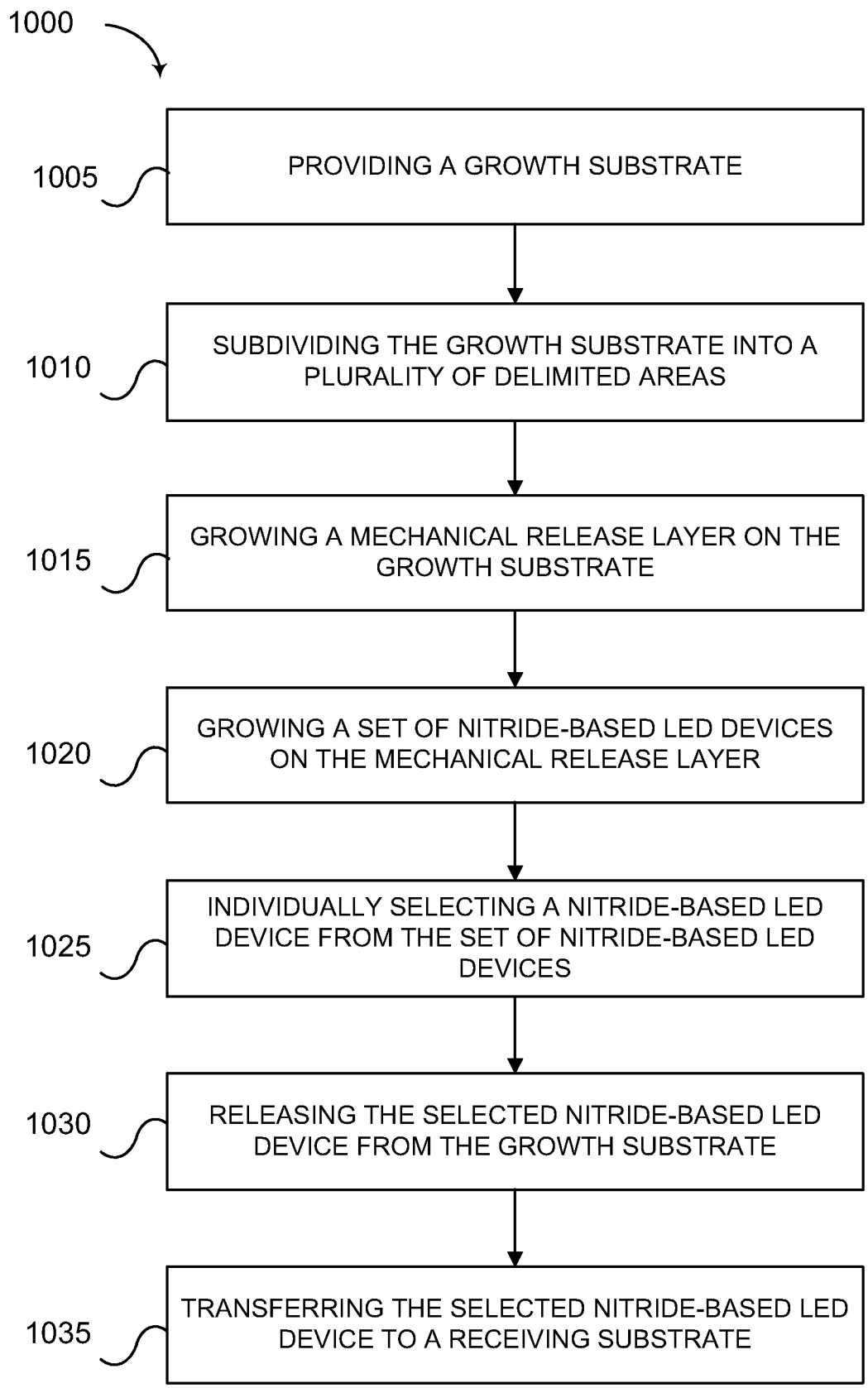
FIG. 10 is a flow diagram outlining the method of growing and releasing nitride-based LED devices, according to some aspects of the present disclosure.

FIG. 10 is a flow diagram outlining the steps of a method 1000 of growing nitride-based LED devices 108 on a growth substrate 102 and transferring individually selected nitride-based LED devices 108 to a receiving substrate 802. The method 1000 can include providing 1005 a growth substrate 102.

The method 1000 can include subdividing 1010 the growth substrate 102 into a plurality of delimited areas 204.

The method 1000 can include growing 1015 a mechanical release layer 104 on the growth substrate 102.

The method 1000 can include growing 1020 a set of nitride-based LED devices 108 on the mechanical release layer 104.

The method 1000 can include individually selecting 1025 a nitride-based LED device 108 from the set of nitride-based LED devices 108.

The method 1000 can include releasing 1030 the selected nitride-based LED device 108 from the growth substrate 102.

The method 1000 can include transferring 1035 the selected nitride-based LED device 108 to a receiving substrate 802.

The ability to individually select a nitride-based LED device 108 from the set of grown nitride-based LED devices 108 grown on the patterned growth substrate 102, release the selected nitride-based LED device 108, and successfully transfer the selected nitride-based LED device 108 without spontaneous delamination of the device 108 using the method described herein can allow industrial level heterogenous integration. The grid 202 used to subdivide the growth substrate 102 into delimited areas 204 can allow high-quality nitride-based LED devices 108 to be grown solely within an individual delimited area 204 and be physically insulated from each other. This configuration can allow a large-scale patterned growth substrate 102 to be used. Once grown, the physically insulated nitride-based LED devices 108 can be easily released and transferred from the growth substrate 102 to the receiving substrate 802 using the pick-and-place technique. Accordingly, the method disclosed herein can provide viable routes for the development of advanced nitride-based LED devices at an industrial scale.

Although, the methods described herein is directed toward nitride-based LED devices, persons of ordinary skill in the art would appreciate that the methods can be applicable with many optoelectronic or electronic device based on gallium nitride materials, including, but not limited to, transistors, detectors, solar cells, and the like.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. Instead, it is intended that the invention is defined by the claims appended hereto.

What is claimed is:

1. A method comprising:
    growing a set of nitride-based devices on a growth substrate pre-patterned into delimited areas physically separated one from another, each physically separated delimited area having a 2D hexagonal boron nitride (2D h-BN) release layer on an exposed growth surface of the growth substrate;
    selecting a nitride-based device from the set of nitride-based devices; and
    releasing the selected nitride-based device;
    wherein the 2D h-BN release layer of each of the physically separated delimited areas is configured to achieve localized van der Waals epitaxy of one of the nitride-based devices of the set of nitride-based devices.

2. The method of claim 1 further comprising:
    subdividing the growth substrate into the physically separated delimited areas; and
    growing the 2D h-BN release layer on the growth substrate;
    wherein growing the set of nitride-based devices comprises growing an individual nitride-based device of the set of nitride-based devices in a respective individual delimited area of the physically separated delimited areas;
    wherein selecting comprises individually selecting an individual nitride-based device;
    wherein releasing comprises individually releasing one or more of the selected nitride-based devices; and
    wherein individually releasing the selected nitride-based devices is via a dicing and cutting free mechanism.

3. The method of claim 2, wherein the growth substrate comprises sapphire.

4. The method of claim 3, wherein the growth substrate is reusable.

5. The method of claim 4 further comprising:
    lateral control of quality of the 2D h-BN release layer;
    wherein the sapphire substrate is subdivided with a $SiO_2$ mask;
    wherein the 2D h-BN release layer is grown laterally on the sapphire substrate; and
    wherein the lateral control of quality of the 2D h-BN achieves the localized van der Waals epitaxy of the nitride-based devices.

6. The method of claim 5, wherein the $SiO_2$ mask has a thickness of between approximately 100 nanometers and approximately 500 nanometers.

7. The method of claim 5, wherein each physically separated delimited area has an area of between approximately one micron squared and approximately one centimeter squared.

8. The method of claim 5, wherein the 2D h-BN release layer has a thickness of between approximately 3 nanometers and approximately 20 nanometers.

9. A method comprising:
    pre-patterning a sapphire substrate into delimited areas physically separated one from another, each physically separated delimited area having an exposed growth surface of the sapphire substrate;
    growing a set of gallium nitride-based devices, one each in a respective one of the physically separated delimited areas, each physically separated delimited area comprising a laterally grown 2D hexagonal boron nitride (2D h-BN) release layer on the exposed growth surface of the sapphire substrate; and
    releasing, individually, one or more of the gallium nitride-based devices via localized van der Waals epitaxy;
    wherein lateral control of quality of the 2D h-BN release layer achieves the localized van der Waals epitaxy.

10. The method of claim 9 further comprising:
    transferring the released gallium nitride-based device to a receiving substrate.

11. The method of claim 10, wherein one or more of:
    the gallium nitride-based devices are LED devices;
    the sapphire substrate is reusable;

the sapphire substrate is subdivided into the physically separated delimited areas using a grid comprising dielectric material having a thickness of between approximately 100 nanometers and approximately 500 nanometers;

the 2D h-BN release layer has a thickness of between approximately 3 nanometers and approximately 20 nanometers; or laterally growing the 2D h-BN release layer comprises laterally growing the 2D h-BN release layer on the exposed growth surface of the sapphire substrate in a metal-organic chemical vapor deposition growth chamber at a temperature of between approximately 1000° C. to approximately 1400° C.

12. The method of claim 11, wherein growing the set of LED devices comprises:
   growing a nucleation layer comprising aluminum gallium nitride on top of the 2D h-BN release layer;
   growing an n-layer comprising gallium nitride doped with silicon on top of the nucleation layer;
   positioning quantum wells on top of the n-layer; and
   growing a p-layer on top of the quantum wells;
   wherein the quantum wells comprise one or more periods, each period including a barrier layer and a quantum well layer.

13. The method of claim 12, wherein the nucleation layer has a thickness of approximately 250 nanometers; and
   wherein the n-layer has a thickness of approximately 500 nanometers.

14. The method of claim 12, wherein the quantum well layer comprises indium gallium nitride; and
   wherein the quantum well layer has a thickness of between approximately 2 nanometers to approximately 4 nanometers.

15. The method of claim 11, wherein the transferred LED device exhibits a blue light emission of between approximately 400 nanometers and approximately 450 nanometers.

16. A nitride-based LED device made by the method of claim 11.

17. The method of claim 10, wherein the receiving substrate is a flexible metallic tape.

18. The method of claim 10, wherein the receiving substrate is a flexible aluminum tape.

19. The method of claim 10, wherein the gallium nitride-based device remains substantially intact when transferred to the receiving substrate.

20. The method of claim 10, wherein the gallium nitride-based device remains free of cracks or fractures when transferred to the receiving substrate.

21. A method comprising:
   growing a mechanical release layer directly on a growth surface of a growth substrate subdivided into delimited areas physically separated one from another;
   growing a set of nitride-based LED devices, one each on the mechanical release layer of one of the physically separated delimited areas;
   individually selecting a nitride-based LED device from the set of nitride-based LED devices;
   releasing the selected nitride-based LED device from the growth substrate via a dicing and cutting free mechanism directly resultant from the arrangement of the physically separated delimited areas; and
   transferring the selected nitride-based LED device to a receiving substrate;
   wherein releasing the selected nitride-based LED device comprises:
      positioning a liquid dissolvable tape on a support of a device capable of moving linearly with respect to a vertical axis;
      lowering the support such that the liquid dissolvable tape contacts the selected nitride-based LED device;
      affixing the selected nitride-based LED device to the liquid dissolvable tape; and
      removing the selected nitride-based LED device from the growth substrate by vertically lifting the support.

22. The method of claim 21, wherein the liquid dissolvable tape is water dissolvable.

23. The method of claim 21, wherein the liquid dissolvable tape dissolves in water within approximately one minute.

24. The method of claim 21 further comprising dissolving the liquid dissolvable tape from the nitride-based LED device after the selected nitride-based LED device is transferred to the receiving substrate.

25. A method comprising:
   growing a hexagonal boron nitride (h-BN) mechanical release layer on a growth substrate subdivided into delimited areas, each physically separated delimited area having an exposed growth surface of the growth substrate, the physically separated delimited areas separated one from another via a grid comprising dielectric material on the growth surface of the growth substrate, and the physically separated delimited areas forming discrete areas for nitride-based device growth;
   growing one or more nitride-based devices, each one of the one or more nitride-based devices grown in a respective one of the discrete areas for nitride-based device growth;
   selecting a nitride-based device from the one or more nitride-based devices; and
   releasing the selected nitride-based device via a dicing and cutting free mechanism;
   wherein:
      portions of the mechanical release layer directly grown on the growth surface in the discrete areas for nitride-based device growth are of a controlled quality of laterally grown h-BN layers stacked together via van der Waals interactions, the control of the quality of the h-BN layers providing for localized van der Waals epitaxy of a single grown nitride-based device in a single discrete area for nitride-based device growth;
      portions of the mechanical release layer directly grown on the grid are of a reduced quality from those portions of the mechanical release layer forming the discrete areas for nitride-based device growth; and
      the releasing is dicing and cutting free as a direct result from:
         the reduced quality portions of the mechanical release layer directly grown on the grid; and
         the physical separation of each of the discrete areas for nitride-based device growth from one another.

* * * * *